United States Patent
Liu et al.

(10) Patent No.: US 12,380,957 B2
(45) Date of Patent: Aug. 5, 2025

(54) MEMORY DEVICE, LAYOUT, AND METHOD

(71) Applicant: TAIWAN SEMICONDUCTOR MANUFACTURING COMPANY, LTD., Hsinchu (TW)

(72) Inventors: Hsiang-Wei Liu, Hsinchu (TW); Andy Yang, Hsinchu (TW); Yao-Jen Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 958 days.

(21) Appl. No.: 17/393,121

(22) Filed: Aug. 3, 2021

(65) Prior Publication Data
US 2022/0352185 A1   Nov. 3, 2022

Related U.S. Application Data

(60) Provisional application No. 63/182,737, filed on Apr. 30, 2021.

(51) Int. Cl.
| | | |
|---|---|---|
| *G11C 17/18* | (2006.01) | |
| *G11C 5/02* | (2006.01) | |
| *G11C 17/16* | (2006.01) | |
| *H01L 21/768* | (2006.01) | |
| *H01L 23/522* | (2006.01) | |
| *H10B 20/25* | (2023.01) | |

(52) U.S. Cl.
CPC .............. *G11C 17/18* (2013.01); *G11C 5/025* (2013.01); *G11C 17/16* (2013.01); *H01L 21/76802* (2013.01); *H01L 23/5226* (2013.01); *H10B 20/25* (2023.02)

(58) Field of Classification Search
CPC ......... G11C 17/18; G11C 5/025; G11C 17/16; H01L 21/76802; H01L 23/5226; H10B 20/25
See application file for complete search history.

(56) References Cited

U.S. PATENT DOCUMENTS

| | | |
|---|---|---|
| 7,260,442 B2 | 8/2007 | Hwang et al. |
| 9,256,709 B2 | 2/2016 | Yu et al. |
| 2014/0040838 A1 | 2/2014 | Liu et al. |

(Continued)

*Primary Examiner* — Yara B Green
*Assistant Examiner* — Akhee Sarker-Nag
(74) *Attorney, Agent, or Firm* — Hauptman Ham, LLP

(57) ABSTRACT

An integrated circuit (IC) device includes transistor and programmable structure regions. The transistor region includes a source structure configured to receive a reference voltage, a first portion of a drain structure, and a gate electrode positioned between the source structure and the first portion of the drain structure, and configured to receive an activation signal. The programmable structure region includes a second portion of the drain structure, a first signal line configured to receive an operational voltage, a second signal line, a gate via underlying and electrically connected to the first signal line, and a drain via positioned between and electrically connected to the second portion of the drain structure and the second signal line. Portions of the first signal line including a gate via location and the second signal line including a drain via location are positioned in parallel in a same metal layer of the IC device.

20 Claims, 11 Drawing Sheets

(56) References Cited

U.S. PATENT DOCUMENTS

2015/0278429 A1   10/2015  Chang
2017/0053925 A1*  2/2017  Wong .................. H01L 23/5252
2017/0076757 A1*  3/2017  Wu ......................... G11C 11/24
2021/0343696 A1* 11/2021  Chae ...................... H10D 89/10
2021/0343699 A1* 11/2021  Kim .................... H01L 23/5226

* cited by examiner

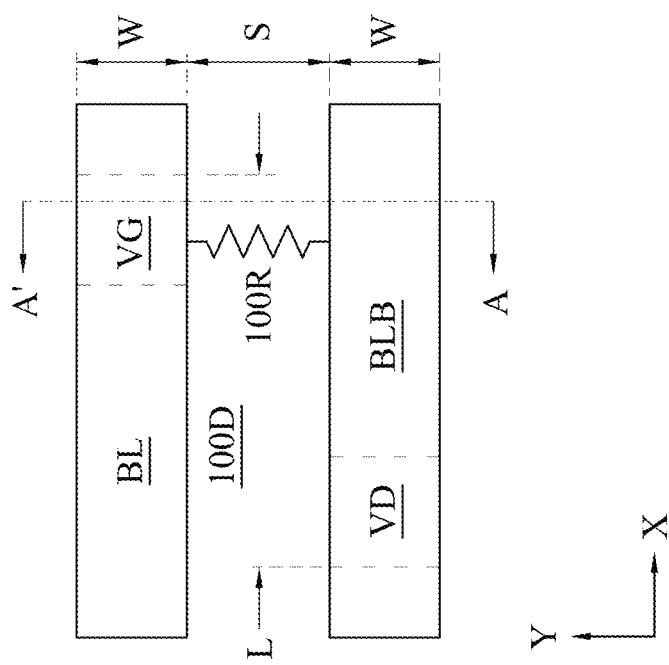
FIG. 2B
FIG. 2A

MEMORY DEVICE, LAYOUT, AND METHOD

PRIORITY CLAIM

The present application claims the priority of U.S. Provisional Application No. 63/182,737, filed Apr. 30, 2021, which is incorporated herein by reference in its entirety.

BACKGROUND

Integrated circuits (ICs) sometimes include one-time-programmable (OTP) memory elements to provide non-volatile memory (NVM) in which data is not lost when the IC is powered off. OTP memory is a type of NVM that permits data to be written once to memory. Once the memory has been programmed, it retains its value upon loss of power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B are diagrams of an IC device, in accordance with some embodiments.

DETAILED DESCRIPTION

Figures 1A, 1B:
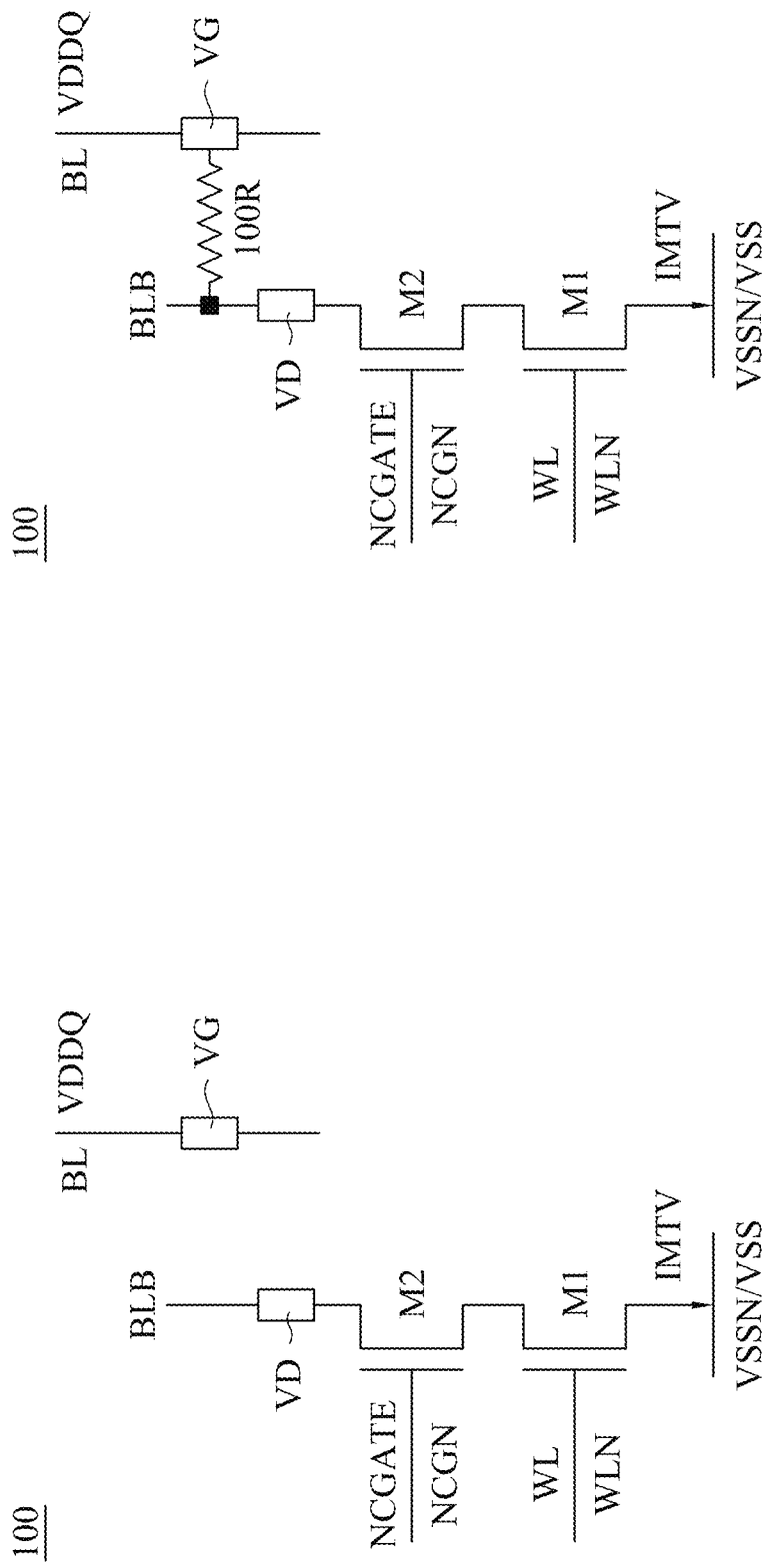
FIGS. 1A and 1B are schematic diagrams of an IC device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC device based on an IC layout diagram includes first and second parallel metal lines separated by a dielectric layer in a same metal layer. The first metal line overlies a gate via and is configured to receive an operational voltage, and the second metal line overlies a drain via controllably coupled to a reference voltage through a transistor. The operational voltage has a programming magnitude sufficiently large to create a breakdown path through the dielectric layer, e.g., between the gate via and the second metal line or between the drain via and the first metal line. The operational voltage has a read magnitude that is less than the programming magnitude and is sufficiently large to generate a detectable current through the breakdown path in the dielectric layer.

The IC device is thereby configured as an OTP device, e.g., a bit cell of a bit cell array, in which non-programmed and programmed states correspond to separate logic levels. Compared to approaches in which a metal line of an OTP bit cell is configured to be fused in a programming operation, the IC device is capable of performing a programming operation using less current, thereby including transistors having smaller channel sizes and reducing overall bit cell size.

FIGS. 1A and 1B are schematic diagrams of an IC device 100, in accordance with some embodiments. IC device 100, also referred to as a bit cell 100 in some embodiments, includes transistors M1 and M2 coupled in series between a drain via VD and a reference voltage node VSSN, a metal line BLB coupled to drain via VD, and a metal line BL coupled to a gate via VG. FIG. 1A is a diagram of IC device 100 in the non-programmed state prior to a programming operation, and FIG. 1B is a diagram of IC device 100 in the programmed state following the programming operation.

Each of the figures herein, e.g., FIGS. 1A-6, is simplified for the purpose of illustration. The figures are views of IC structures and devices with various features included and excluded to facilitate the discussion below. In various embodiments, an IC structure, device and/or layout diagram includes one or more features corresponding to power distribution structures, metal interconnects, contacts, vias, gate structures or other transistor elements, isolation structures, or the like, in addition to the features in FIGS. 1A-6.

Transistor M1 includes a source/drain (S/D) terminal coupled to reference voltage node VSSN, a gate coupled to a signal node WLN, and an S/D terminal coupled to an S/D terminal of transistor M2. Transistor M2 also includes a gate coupled to a signal node NCGN and an S/D terminal coupled to drain via VD.

As in FIG. 1A, in the non-programmed state, metal line BLB and drain via VD are electrically isolated from metal line BL and gate via VG by a dielectric layer (not shown), e.g., a dielectric layer 100D discussed below with respect to FIGS. 2A and 2B. As in FIG. 1B, in the programmed state, metal line BLB and drain via VD are coupled to metal line BL and gate via VG through a breakdown path 100R through the dielectric layer. In the embodiment in FIGS. 1B-2B, breakdown path 100R is located between metal line BLB and gate via VG. In some embodiments, breakdown path 100R is located between drain via VD and metal line BL or between metal line BLB and metal line BL.

IC device 100 is thereby configured to, in operation, receive an operational voltage VDDQ on metal line BL (and thereby on gate via VG), a reference voltage VSS on reference voltage node VSSN, an activation signal WL on signal node WLN, and a bias signal NCGATE on signal node NCGN. Transistor M1 is configured to selectively couple transistor M2 to reference voltage node VSSN responsive to activation signal WL, and transistor M2 is configured to selectively couple drain via VD and metal line BLB to transistor M1 responsive to bias signal NCGATE.

Activation signal WL and bias signal NCGATE are configured to, in operation, cause transistors M1 and M2 to be switched on simultaneously, thereby coupling drain via VD and metal line BLB to reference voltage node VSSN such that reference voltage VSS is received on drain via VD and metal line BLB.

In the embodiment of FIGS. 1A and 1B, each of transistors M1 and M2 is an n-type metal-oxide-semiconductor (NMOS) transistor configured to be switched on in response to a high logical value of the corresponding activation signal WL or bias signal NCGATE. In some embodiments, one or both of transistors M1 or M2 is a p-type metal-oxide-semiconductor (PMOS) transistor configured to be switched on in response to a low logical value of the corresponding activation signal WL or bias signal NCGATE.

In the embodiment of FIGS. 1A and 1B, transistors M1 and M2 have a cascode arrangement whereby a total voltage drop across transistors M1 and M2 is capable of exceeding a voltage rating of one or both of transistors M1 and M2 such that damage to transistors M1 and M2 is avoided when operational voltage VDDQ has a magnitude above the voltage rating, e.g., during programming and/or read operations as discussed below.

In accordance with the cascode arrangement of transistors M1 and M2, bias signal NCGATE has one or more voltage levels greater than those of activation signal WL such that one or more differences between the voltage levels of bias signal NCGATE and activation signal WL are less than the voltage rating of one or both of transistors M1 and M2.

In some embodiments, IC device 100 includes one more transistors in addition to transistors M1 and M2 in the cascode arrangement, the one or more additional transistors being configured to receive a corresponding one or more bias signals having relationships analogous to those discussed above with respect to bias signal NCGATE and activation signal WL. In some embodiments, IC device 100 does not include transistor M2, transistor M1 is directly coupled to drain via VD, and drain via VD is selectively coupled to reference voltage node VSSN solely through transistor M1 responsive to activation signal WL.

In various embodiments, one or both of transistors M1 or M2 is a standard threshold voltage (SVT) device, a low threshold voltage (LVT) device, a high voltage threshold (HVT) device, a high voltage (HV) device, an input-output (IO) device, or another suitable device capable of selectively coupling drain via VD to reference voltage node VSSN.

In operation, a combination of reference voltage VSS on drain via VD and metal line BLB and operational voltage VDDQ on metal line BL and gate via VG acts to generate an electric field across the dielectric layer. In the programming operation, operational voltage VDDQ has a sufficiently large programming magnitude relative to reference voltage VSS to generate the electric field capable of breaking down the dielectric layer, thereby creating breakdown path 100R.

In a read operation, operational voltage VDDQ has a read magnitude relative to reference voltage VSS corresponding to an electric field strength below a breakdown level of the dielectric layer, the read magnitude thereby being less than the programming magnitude. The read magnitude is sufficiently large to generate a current IMTV that flows from metal line BL to reference voltage node VSSN.

In some embodiments, operational voltage VDDQ relative to reference voltage VSS, and therefore current IMTV, have positive polarities in one or both of the programming or read operations. In some embodiments, operational voltage VDDQ relative to reference voltage VSS, and therefore current IMTV, have negative polarities in one or both of the programming or read operations.

The read magnitude of operational voltage VDDQ generates current IMTV having a relatively low current level, e.g., near 0 amperes (A), based on the intact dielectric layer when IC device 100 is in the non-programmed state of FIG. 1A, and having a relatively high current level, e.g., greater than 1 microampere (μA), based on the presence of breakdown path 100R when IC device 100 is in the programmed state of FIG. 1B.

IC device 100 thereby includes metal lines BLB and BL, drain via VD, and gate via VG configured as a programmable structure in which the non-programmed state corresponds to the relatively low level of current IMTV and a first logic level, e.g., a low logic level, and the programmed state corresponds to the relatively high level of current IMTV and a second logic level, e.g., a high logic level.

Compared to approaches in which a metal line of an OTP bit cell is configured to be fused in a programming operation, IC device 100 is thereby capable of performing a programming operation using less current, thereby including transistors having smaller channel sizes and reducing overall bit cell size.

FIGS. 2A and 2B are diagrams of IC device 100, in accordance with some embodiments. FIG. 2A is a plan view of IC device 100 and includes X and Y directions and a line A-A'. FIG. 2B is a cross-sectional view of IC device 100 corresponding to line A-A' and includes Y and Z directions. Each of FIGS. 2A and 2B is a view of programmable structure elements of IC device 100 and does not include elements of transistors M1 and M2 for the purpose of illustration.

The embodiment of FIGS. 2A and 2B is a non-limiting example provided for the purpose of illustration. In some embodiments, IC device 100 includes programmable structure elements having a configuration other than that of FIGS. 2A and 2B whereby IC device 100 is capable of having the non-programmed and programmed states discussed above.

In the embodiment of FIGS. 2A and 2B, metal lines BL and BLB extend in the X direction in parallel and are separated by a distance S across dielectric layer 100D in a same metal layer. In the embodiment of FIGS. 2A and 2B, breakdown path 100R is present and extends through dielectric layer 100D in the Y direction. In some embodiments, breakdown path 100R is not present or extends in a direction other than the Y direction.

Metal line BL overlies and directly contacts gate via VG, which overlies and directly contacts a gate structure GS. Metal line BLB overlies and directly contacts drain via VD, which overlies and directly contacts a conductive segment MD, also referred to as a drain structure MD or a source/drain (S/D) structure MD in some embodiments. Each of gate structure GS and conductive layer MD overlies and directly contacts a substrate 100B.

Each of a metal line, e.g., metal line BL or BLB, and a via, e.g., gate via VG or drain via VD, is a volume including one or more conductive materials. A conductive material is one or more of copper (Cu), silver (Ag), tungsten (W), titanium (Ti), nickel (Ni), tin (Sn), aluminum (Al) or another metal or material, e.g., polysilicon, suitable for providing a low resistance electrical connection between IC structure elements, i.e., a resistance level below a predetermined threshold corresponding to one or more tolerance levels of a resistance-based effect on circuit performance.

A dielectric layer, e.g., dielectric layer 100D, is a volume including one or more insulating materials, e.g., silicon dioxide and/or one or more other suitable material such as a low-k material having a k value less than 3.8 or a high-k material having a k value greater than 3.8, suitable for providing a high electrical resistance between IC structure elements, i.e., a resistance level above a predetermined threshold corresponding to one or more tolerance levels of a resistance-based effect on circuit performance.

A gate structure, e.g., gate structure GS, is a volume including one or more conductive segments, e.g., a gate electrode, including one or more conductive materials, e.g., polysilicon, one or more metals, and/or one or more other suitable materials, substantially surrounded by one or more insulating materials, the one or more conductive segments thereby being configured to control a voltage provided to an underlying gate dielectric layer.

In some embodiments, a conductive segment, e.g., conductive segment MD, includes a portion of at least one metal layer, e.g., a contact layer, overlying and contacting the substrate and having a thickness sufficiently small to enable formation of an insulation layer between the MD segment and an overlying metal layer, e.g., a metal zero layer.

In various embodiments, a conductive segment includes a section of the semiconductor substrate, e.g., substrate 100B, and/or an epitaxial layer having a doping level, e.g., based on an implantation process, sufficient to cause the segment to have the low resistance level. In various embodiments, a doped conductive segment includes one or more of silicon (Si), silicon-germanium (SiGe), silicon-carbide (SiC), boron (B), phosphorous (P), arsenic (As), gallium (Ga), a metal as discussed above, or another material suitable for providing the low resistance level. In some embodiments, an MD segment includes a dopant having a doping concentration of about $1*10^{16}$ per cubic centimeter (cm-3) or greater.

In various embodiments, one or more conductive regions overlaps one or more active areas, e.g., an active area A1 or A2 discussed below with respect to FIGS. 3-5. An active area is a continuous section of the semiconductor substrate having either n-type or p-type doping that includes various semiconductor structures suitable for forming one or more transistors.

FIG. 2B includes solid-line depictions of the cross-sections of metal lines BL and BLB, gate via VG, and gate structure GS in the Y-Z plane corresponding to line A-A', and dashed-line depictions of the cross-sections of drain via VD and conductive segment MD in a Y-Z plane (not labeled) offset from line A-A' in the negative X direction.

Gate via VG and drain via VD are offset from each other in the X direction such that gate via VG and drain via VD span a total distance L in the X direction. In some embodiments, the offset in the X direction corresponds to gate VG being aligned with a gate structure, e.g., gate structure GS, and drain via VD being aligned with a drain structure, e.g., conductive structure MD, offset from the gate structure in the X direction.

Distance L corresponds to at least a portion of metal line BL including a location of gate via VG and at least a portion of metal line BLB including drain via VD being positioned in parallel in the same metal layer. In the embodiment of FIGS. 2A and 2B, distance L corresponds to portions of metal lines BL and BLB having a same length (not labeled) and being aligned in the Y direction. In some embodiments, distance L corresponds to metal lines BL and BLB being otherwise configured, e.g., by having different lengths, such that portions of metal lines BL and BLB are positioned in parallel in the same metal layer. In some embodiments, distance L corresponds to the only portions of metal lines BL and BLB that are positioned in parallel in the same metal layer, e.g., an overlap of metal lines BL and BLB in the Y direction.

Each of metal lines BL and BLB, gate via VG, and drain via VD has a width W in the Y direction. Because each of metal lines BL and BLB, gate via VG, and drain via VD tapers from a widest point at the top (maximum extension in the positive Z direction) to a narrowest point at the bottom (maximum extension in the negative Z direction), width W represents a maximum width in the Y direction. In the embodiment of FIGS. 2A and 2B, each of metal lines BL and BLB, gate via VG, and drain via VD has a same value of width W. In some embodiments, one or more of metal lines BL or BLB, gate via VG, or drain via VD has a value of width W different from one or more values of width W of another one or more of metal lines BL or BLB, gate via VG, or drain via VD.

In the programming operation discussed above with respect to FIGS. 1A and 1B, operational voltage VDDQ on metal line BL and gate via VG combined with reference voltage VSS on metal line BLB and drain via VD are configured to create breakdown path 100R through dielectric layer 100D based on the configuration and dimensions of metal lines BL and BLB, gate via VG, and drain via VD.

Accordingly, distance L corresponds to the overlapping portions of metal lines BL and BLB in the X direction at which breakdown path 100R is potentially located such that increasing values of distance L correspond to increasing likelihood of establishing breakdown path 100R for a given combination of operational voltage VDDQ and reference voltage VSS. In some embodiments, distance L has a value greater than or equal to 20 nanometers (nm). In some embodiments, distance L has a value greater than or equal to 40 nm.

In some embodiments, distance L has a minimum value corresponding to the separation between gate via VG and drain via VD in the X direction being based on positioning of underlying structures, e.g., gate structure GS and conductive segment MD. In some embodiments, gate via VG and drain via VD are separated in the X direction by a value ranging from 5 nm to 20 nm. In some embodiments, gate via VG and drain via VD are separated in the X direction by a value ranging from 8 nm to 15 nm.

Distance S corresponds to a length of breakdown path 100R such that a minimum value of distance S is greater than or equal to a minimum spacing rule for metal lines BL and BLB, and increasing values of distance S correspond to increasing lengths of breakdown path 100R. Increasing lengths of breakdown path 100R correspond to increasing values of the programming magnitude of operational voltage VDDQ relative to reference voltage VSS. In some embodiments, distance S has a value ranging from 5 nm to 50 nm. In some embodiments, distance S has a value ranging from 10 nm to 30 nm.

Width W corresponds to an area requirement for the programmable structure elements of IC device 100 such that increasing values of width W correspond to increasing area requirements. In some embodiments, width W has a value ranging from 5 nm to 50 nm. In some embodiments, width W has a value ranging from 10 nm to 30 nm.

In the embodiment of FIGS. 2A and 2B, a cross-section of each of gate via VG and drain via VD in the X-Y plane has a square shape such that a length (not labeled) in the X direction is approximately the same as width W. In some embodiments, the cross-section of one or both of gate via VG or drain via VD in the X-Y plane has a rectangular shape such that the length is greater than width W. In some embodiments, increasing values of the length correspond to increasing likelihood of establishing breakdown path 100R for a given combination of operational voltage VDDQ and reference voltage VSS. In some embodiments, one or both of gate via VG or drain via VD has the length having a value ranging from 10 nm to 75 nm. In some embodiments, one or both of gate via VG or drain via VD has the length having a value ranging from 20 nm to 50 nm.

The difference between the programming magnitude of operational voltage VDDQ relative to reference voltage VSS required to create breakdown path 100R is based on the configuration of the programmable structure elements discussed above including the material composition of dielectric layer 100D. For a given value of reference voltage VSS, e.g., a ground voltage level, increasing values of the programming magnitude of operational voltage VDDQ correspond to increasing circuit design considerations, e.g., increasing numbers of cascode transistors. In some embodiments, the configuration of the programmable structure elements of IC device 100 correspond to the programming magnitude of operational voltage VDDQ having a value relative to reference voltage VSS ranging from 1.0 volts (V) to 7.0 V. In some embodiments, the configuration of the programmable structure elements of IC device 100 correspond to the programming magnitude of operational voltage VDDQ having a value relative to reference voltage VSS ranging from 1.8 V to 5.0 V.

In the embodiment of FIGS. 2A and 2B, during the programming operation, charge densities (and thereby local electric field strengths) at the topmost portion of gate via VG closest to metal line BLB and the topmost portion of drain via VD closest to metal line BL are greater than those at adjacent locations such that breakdown path 100R is more likely to be created between gate via VG and metal line BLB or drain VD and metal line BL than between metal lines BL and BLB. In some embodiments, breakdown path 100R is referred to as a metal-to-via (MTV) breakdown path 100R, or MTV fuse 100R.

In the embodiment of FIGS. 2A and 2B, the programmable structure elements of IC device 100 include single instances of each of metal lines BL and BLB, gate via VG, and drain via VD configured as discussed above. In some embodiments, e.g., IC devices 300-500 discussed below with respect to FIGS. 3-5, programmable structure elements include at least two instances of one or more of metal lines BL and/or BLB, gate via VG, and/or drain via VD configured as discussed above. In some embodiments, increasing numbers of the at least two instances of one or more of metal lines BL and/or BLB, gate via VG, and/or drain via VD correspond to increasing likelihood of establishing breakdown path 100R for a given combination of operational voltage VDDQ and reference voltage VSS.

In the embodiment of FIGS. 2A and 2B, metal lines BL and BLB and dielectric layer 100D correspond to a metal zero layer of IC device 100. In some embodiments, metal lines BL and BLB and dielectric layer 100D correspond to a metal layer above the metal zero layer of IC device 100, e.g., a first or second metal layer, each of which overlies and is electrically connected to a corresponding via instead of gate via VG and drain via VD.

As discussed above, IC device 100 is thereby configured as an OTP device, e.g., a bit cell of a bit cell array, capable of having non-programmed and programmed states corresponding to separate logic levels. Compared to approaches in which a metal line of an OTP bit cell is configured to be fused in a programming operation, IC device 100 is capable of performing a programming operation using less current, thereby including transistors having smaller channel sizes and reducing overall bit cell size.

Figure 3:
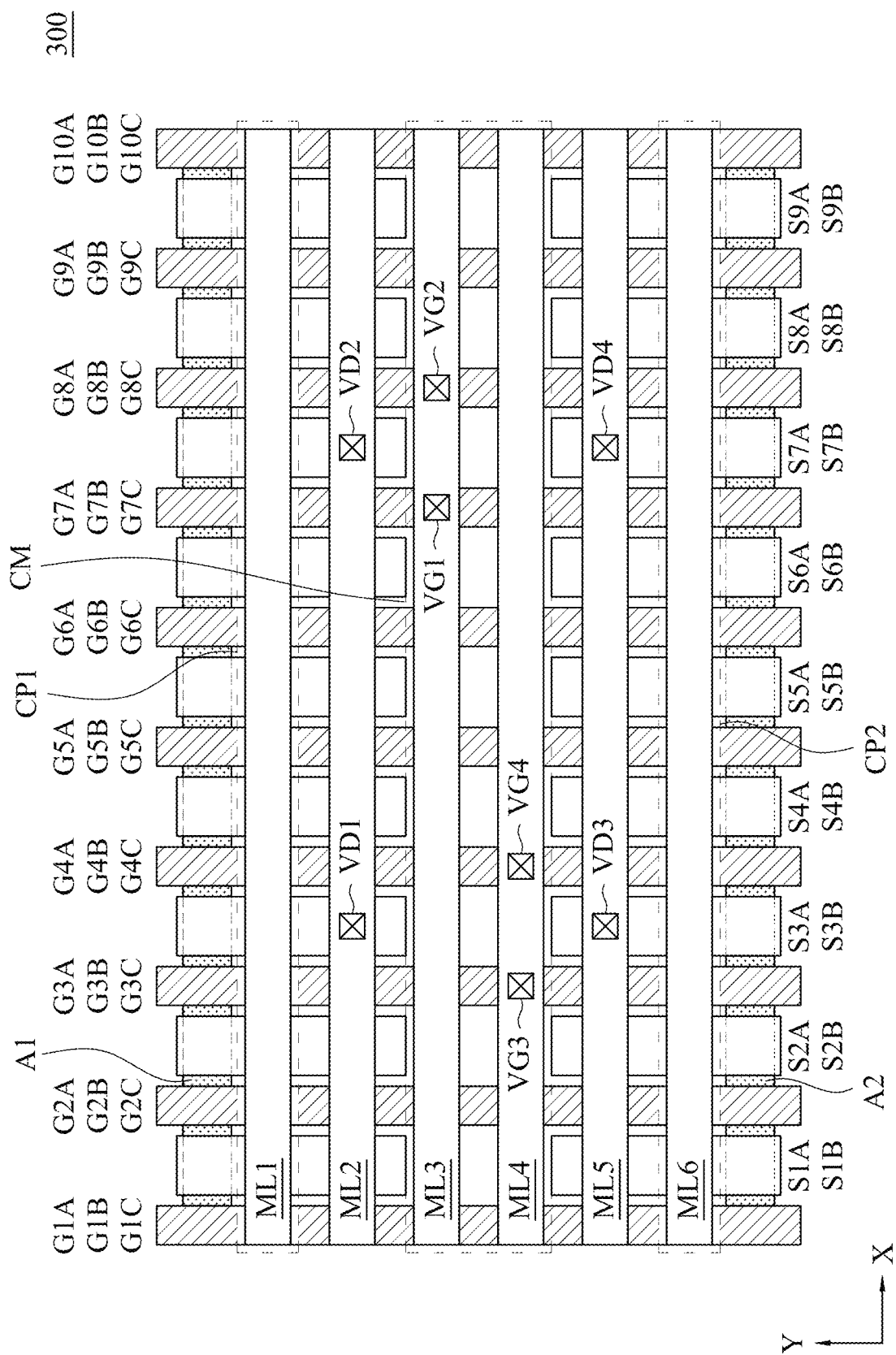
FIG. 3 is a diagram of an IC device, in accordance with some embodiments.
Figure 4:
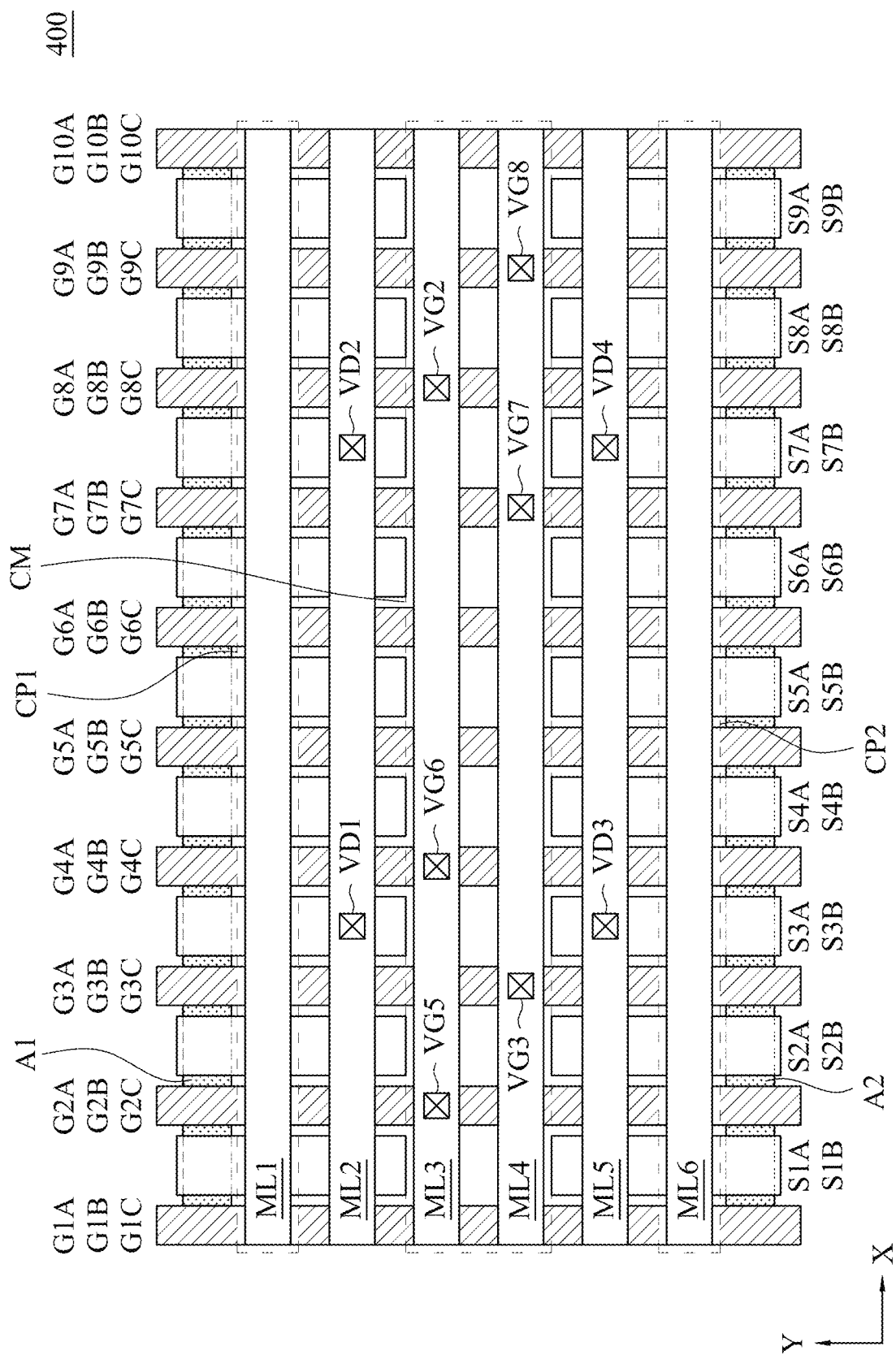
FIG. 4 is a diagram of an IC device, in accordance with some embodiments.
Figure 5:
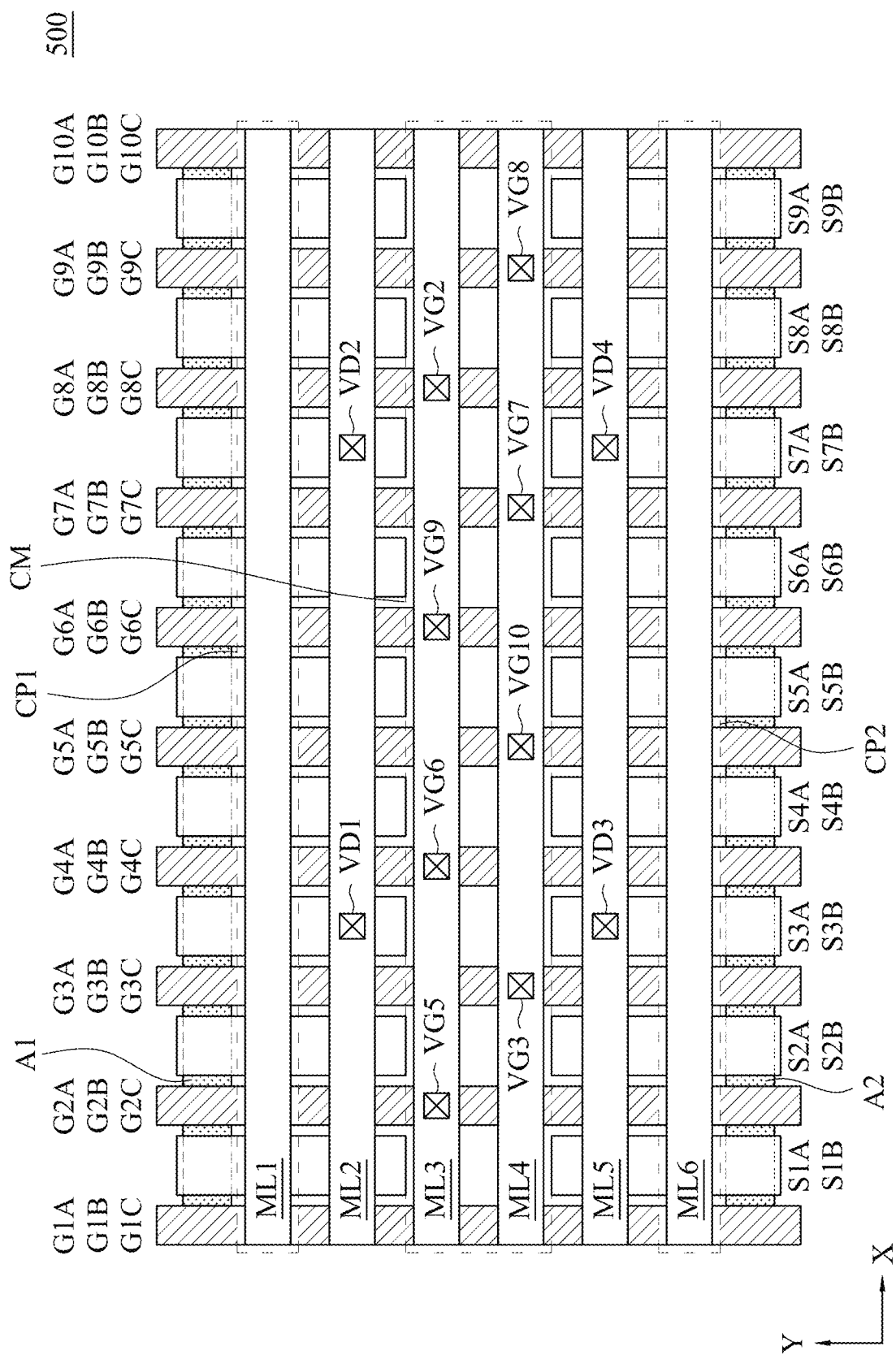
FIG. 5 is a diagram of an IC device, in accordance with some embodiments.

FIGS. 3-5 are diagrams of respective IC devices 300-500, in accordance with some embodiments. Each diagram of FIGS. 3-5 represents both an IC device 300-500 embodiment and an IC layout diagram 300-500 embodiment usable in a manufacturing process as part of defining the features of the corresponding IC device 300-500. Each of IC devices 300-500 is a non-limiting example corresponding to first and second instances of IC device 100 discussed above with respect to FIGS. 1A-2B.

In some embodiments, the IC layout diagram 300-500 is usable in a method 700 discussed below with respect to FIG. 7 and/or an IC manufacturing flow associated with IC manufacturing system 1100 discussed below with respect to FIG. 11, as part of defining one or more features of the corresponding IC device 300-500.

In some embodiments, an IC layout diagram 300-500 is stored in an IC design storage medium such as an IC design storage 1007 discussed below with respect to FIG. 10. In some embodiments, an IC layout diagram 300-500 is generated by performing one or more operations of a method, e.g., a method 900 discussed below with respect to FIG. 9.

Each of FIGS. 3-5 includes gates G1A/G1B/G1C-G10A/G10B/G10C extending in the Y direction, conductive segments S1A/S1B-S9A/S9B extending in the Y direction between corresponding adjacent instances of gates G1A/G1B/G1C-G10A/G10B/G10C, and metal lines ML1-ML6 extending in the X direction and intersecting corresponding instances of gates G1A/G1B/G1C-G10A/G10B/G10C and conductive segments S1A/S1B-S9A/S9B.

Gates G1A/G1B/G1C-G10A/G10B/G10C represent gate structures in IC device embodiments, and in IC layout embodiments, gate regions usable as part of defining the corresponding gate structures. Conductive segments S1A/S1B-S9A/S9B represent conductive structure segments in IC device embodiments, and in IC layout embodiments, conductive regions usable as part of defining the corresponding conductive structure segments. Metal lines ML1-ML6 represent metal segments in IC device embodiments, and in IC layout embodiments, metal regions usable as part of defining the corresponding metal segments.

A cut region CP1 is represented by a dashed line around metal line ML1, and a cut region CP2 is represented by a dashed line around metal line ML6. In some embodiments, cut region CP1 and CP2 are referred to as cut poly regions CP1 and CP2. In IC layout embodiments, cut regions CP1 and CP2 are regions that define locations at which a given gate structure is divided into electrically isolated gate portions as part of the manufacturing process. A given instance of gates G1A/G1B/G1C-G10A/G10B/G10C thereby represents three electrically isolated gate portions aligned in the Y direction. For example, gate G1A/G1B/G1C represents gate portion G1A extending away from cut region CP1 in the positive Y direction, gate portion G1B extending between cut regions CP1 and CP2 in the Y direction, and gate portion G1C extending away from cut region CP2 in the negative Y direction.

In some embodiments, one or both of cut regions CP1 or CP2 is otherwise configured whereby each instance of gates G1A/G1B/G1C-G10A/G10B/G10C is divided into three electrically isolated gate portions aligned in the Y direction.

A cut metal region CM is represented by a dashed line around metal lines ML3 and ML4. In IC layout embodiments, cut metal region CM is a region that defines locations at which a given conductive segment is divided into electrically isolated segment portions as part of the manufacturing process. A given instance of conductive segments S1A/S1B-S9A/S9B thereby represents two electrically isolated segment portions aligned in the Y direction. For example, conductive segment S1A/S1B represents conductive segment S1A extending away from cut metal region CM in the positive Y direction, and conductive segment S1B extending away from cut metal region CM in the negative Y direction.

Each of FIGS. 3-5 further includes active areas A1 and A2 extending in the X direction and separated from each other by metal lines ML1-ML6. Active areas A1 and A2 represent active areas in IC device embodiments, and in IC layout embodiments, active regions usable as part of defining the corresponding active areas. In the embodiments of FIGS. 3-5, each of active areas A1 and A2 has n-type doping. In some embodiments one or both of active areas A1 or A2 has p-type doping.

Active area A1 intersects each of gates G1A-G10A and conductive segments S1A-S9A, and active area A2 intersects each of gates G1C-G10C and conductive segments S1B-S9B. Each of conductive segments S1A, S5A, S9A, S1B, S5B, and S9B is coupled to reference voltage node VSSN (not shown in FIGS. 3-5) and thereby configured to receive reference voltage VSS discussed above with respect to FIGS. 1A and 1B. Each of gates G1A, G5A, G6A, and G9A is coupled to a first instance of signal node WLN (not shown in FIGS. 3-5) and thereby configured to receive a first instance of activation signal WL, and each of gates G1C, G5C, G6C, and G9C is coupled to a second instance of signal node WLN (not shown in FIGS. 3-5) and thereby configured to receive a second instance of activation signal WL. Each of gates G3A, G4A, G7A, and G8A is coupled to a first instance of signal node NCGN (not shown in FIGS. 3-5) and thereby configured to receive a first instance of bias signal NCGATE and each of gates G3C, G4C, G7C, and G8C is coupled to a second instance of signal node NCGN (not shown in FIGS. 3-5) and thereby configured to receive a second instance of bias signal NCGATE.

Each of gates G1A, G1B, G1C, G10A, G10B, and G10C does not include an electrical connection and is included to improve manufacturability of IC devices 300-500. In some embodiments, gates G1A, G1B, G1C, G10A, G10B, and G10C are referred to as dummy gates. In some embodiments, an IC device 300-500 does not include one or more of gates G1A, G1B, G1C, G10A, G10B, or G10C.

Active area A1, gates G1A-G10A, and conductive segments S1A-S9A thereby correspond to a first transistor region (not labeled in FIGS. 3-5), e.g., a transistor region T1 discussed below with respect to FIG. 6, in which a first instance of IC device 100 discussed above with respect to FIGS. 1A-2B includes a first instance of each of transistors M1 and M2 corresponding to a parallel arrangement of four transistor structures. The first instance of transistor M1 includes conductive segments S1A, S5A, and S9A configured to receive reference voltage VSS and adjacent gates G1A, G5A, G6A, and G9A configured to receive the first instance of activation signal WLN. The first instance of transistor M2 includes gates G3A, G4A, G7A, and G8A configured to receive the first instance of bias signal NCGATE, and adjacent conductive segments S3A and S7A. Conductive segments S2A, S4A, S6A, and S8A are shared S/D terminals of the first instances of transistors M1 and M2.

Similarly, active area A2, gates G1C-G10C, and conductive segments S1B-S9B correspond to a second transistor region (not labeled in FIGS. 3-5), e.g., a transistor region T2 discussed below with respect to FIG. 6, in which a second instance of IC device 100 includes a second instance of each of transistors M1 and M2 corresponding to a parallel arrangement of four transistor structures having configurations analogous to those discussed above with respect to the first transistor region.

In each of the embodiments of FIGS. 3-5, each of conductive segments G3A, G7A, G3B, and G7B includes a portion between cut regions CP1 and CP2 that corresponds to conductive segment MD discussed above with respect to FIG. 2B. A drain via VD1 overlaps the corresponding portion of conductive segment S3A and metal line ML2, a drain via VD2 overlaps the corresponding portion of conductive segment S7A and metal line ML2, a drain via VD3 overlaps the corresponding portion of conductive segment S3B and metal line ML5, and a drain via VD4 overlaps the corresponding portion of conductive segment S7B and metal line ML5. Vias, e.g., drain vias VD1-VD4, represent via structures contacting and electrically connected to overlying and underlying elements in IC device embodiments, and in IC layout embodiments, via regions usable as part of defining the corresponding via structures.

The first instance of IC device 100 thereby includes a first instance of drain via VD corresponding to drain vias VD1 and VD2 coupled to the first instance of transistor M2 and to a first instance of metal line BLB corresponding to metal line ML2. The second instance of IC device 100 thereby includes a second instance of drain via VD corresponding to drain vias VD3 and VD4 coupled to the second instance of transistor M2 and to a second instance of metal line BLB corresponding to metal line ML5.

The first instance of IC device 100 further includes a first instance of metal line BL corresponding to metal line ML3, and the second instance of IC device 100 further includes a second instance of metal line BL corresponding to metal line ML4. As further discussed below, in each of the embodiments of FIGS. 3-5, the first instance of IC device 100 includes a first subset of gate vias VG1-VG10 overlapping metal line ML3 and a corresponding first subset of gates G2B-G9B, and the second instance of IC device 100 includes a second subset of gate vias VG1-VG10 overlapping metal line ML4 and a corresponding second subset of gates G2B-G9B. The first instance of IC device 100 thereby includes the first subset of gate vias VG1-VG10 corresponding to gate via VG and the first subset of gates G2B-G9B corresponding to gate GS discussed above with respect to FIG. 2B. The second instance of IC device 100 thereby includes the second subset of gate vias VG1-VG10 corresponding to gate via VG and the second subset of gates G2B-G9B corresponding to gate GS.

Metal lines ML2-ML5, the first and second subsets of gate vias VG1-VG10 and gates G2B-G9B, drain vias VD1-VD4, and the portions of conductive segments S3A, S7A, S3B, and S7B located between cut regions CP1 and CP2 thereby correspond to a programmable structure region (not labeled in FIGS. 3-5), e.g., a programmable structure region PS discussed below with respect to FIG. 6, between the first and second transistor regions.

In the embodiments of FIGS. 3-5, the programmable structure region is separated from the first transistor region by metal line ML1 and cut region CP1, and from the second transistor region by metal line ML6 and cut region CP2. In some embodiments, each of metal lines ML1 and M16 is referred to as a wall or a fuse wall. In some embodiments, one or more of IC devices 300-500 does not include one or both of metal lines ML1 or ML6 or includes one or more metal lines and/or cut regions in addition to metal lines ML1 and/or ML6 or cut regions CP1 and/or CP2 between the programmable structure region and one or both of the first or second transistor regions.

In the embodiment of FIG. 3, IC device 300 includes gate vias VG1 and VG2 overlapping metal line ML3 and respective gates G7B and G8B, gate vias VG1 and VG2 thereby corresponding to the first subset of gate vias VG1-VG10, and gates G7B and G8B thereby corresponding to the first subset of gates G2B-G9B. IC device 300 further includes gate vias VG3 and VG4 overlapping metal line ML4 and respective gates G3B and G4B, gate vias VG3 and VG4 thereby corresponding to the second subset of gate vias VG1-VG10, and gates G3B and G4B thereby corresponding to the second subset of gates G2B-G9B.

IC device 300 thereby includes gate vias VG1 and VG2 configured as a first gate via pair adjacent to conductive structure S7A, and gate vias VG3 and VG4 configured as a second gate via pair adjacent to conductive structure S3B.

In the embodiment of FIG. 4, IC device 400 includes gate vias VG5, VG6, and VG2 overlapping metal line ML3 and respective gates G2B, G4B, and G8B, gate vias VG5, VG6, and VG2 thereby corresponding to the first subset of gate vias VG1-VG10, and gates G2B, G4B, and G8B thereby corresponding to the first subset of gates G2B-G9B. IC device 400 further includes gate vias VG3, VG7, and VG8 overlapping metal line ML4 and respective gates G3B, G7B, and G9B, gate vias VG3, VG7, and VG8 thereby corresponding to the second subset of gate vias VG1-VG10, and gates G3B, G7B, and G9B thereby corresponding to the second subset of gates G2B-G9B.

IC device 400 thereby includes gate vias VG3, VG5, and VG6 configured as a first triangle pattern of gate vias adjacent to conductive structure S3A, and gate vias VG2, VG7, and VG8 configured as a second triangle pattern of gate vias adjacent to conductive structure S7B.

In the embodiment of FIG. 5, IC device 500 includes gate vias VG5, VG6, VG9, and VG2 overlapping metal line ML3 and respective gates G2B, G4B, G6B, and G8B, gate vias VG5, VG6, VG9, and VG2 thereby corresponding to the first subset of gate vias VG1-VG10, and gates G2B, G4B, G6B, and G8B thereby corresponding to the first subset of gates G2B-G9B. IC device 500 further includes gate vias VG3, VG10, VG7, and VG8 overlapping metal line ML4 and respective gates G3B, G5B, G7B, and G9B, gate vias VG3, VG10, VG7, and VG8 thereby corresponding to the second subset of gate vias VG1-VG10, and gates G3B, G5B, G7B, and G9B thereby corresponding to the second subset of gates G2B-G9B.

IC device 500 thereby includes gate vias VG3, VG5, VG6, and VG10 configured as a first parallelogram pattern of gate vias adjacent to conductive structure S3A, and gate vias VG2 and VG7-VG9 configured as a second parallelogram pattern of gate vias adjacent to conductive structure S7B.

Each of IC devices 300-500 is thereby configured to correspond to first and second instances of IC device 100 including a programmable structure region between first and second transistor regions, each of the instances of IC device 100 corresponding to the embodiment discussed above with respect to FIGS. 1A-2B. In some embodiments, an IC device is otherwise configured, e.g., by including first and/or second subsets including single instances of gates/gate vias, to correspond to first and second instances of IC device 100 including a programmable structure region between first and second transistor regions, each of the instances of IC device 100 corresponding to the embodiment discussed above with respect to FIGS. 1A-2B. In some embodiments, an IC device includes subsets of the elements discussed above with respect to FIGS. 3-5 so as to correspond to a single instance of IC device 100 corresponding to the embodiment discussed above with respect to FIGS. 1A-2B.

As discussed above, each of IC devices 300-500 is thereby configured as an OTP device, e.g., a bit cell pair of a bit cell array, capable of having non-programmed and programmed states corresponding to separate logic levels. Compared to approaches in which metal lines of OTP bit cells are configured to be fused in programming operations, each of IC devices 300-500 is capable of performing programming operations using less current, thereby including transistors having smaller channel sizes and reducing overall bit cell size.

Figure 6:
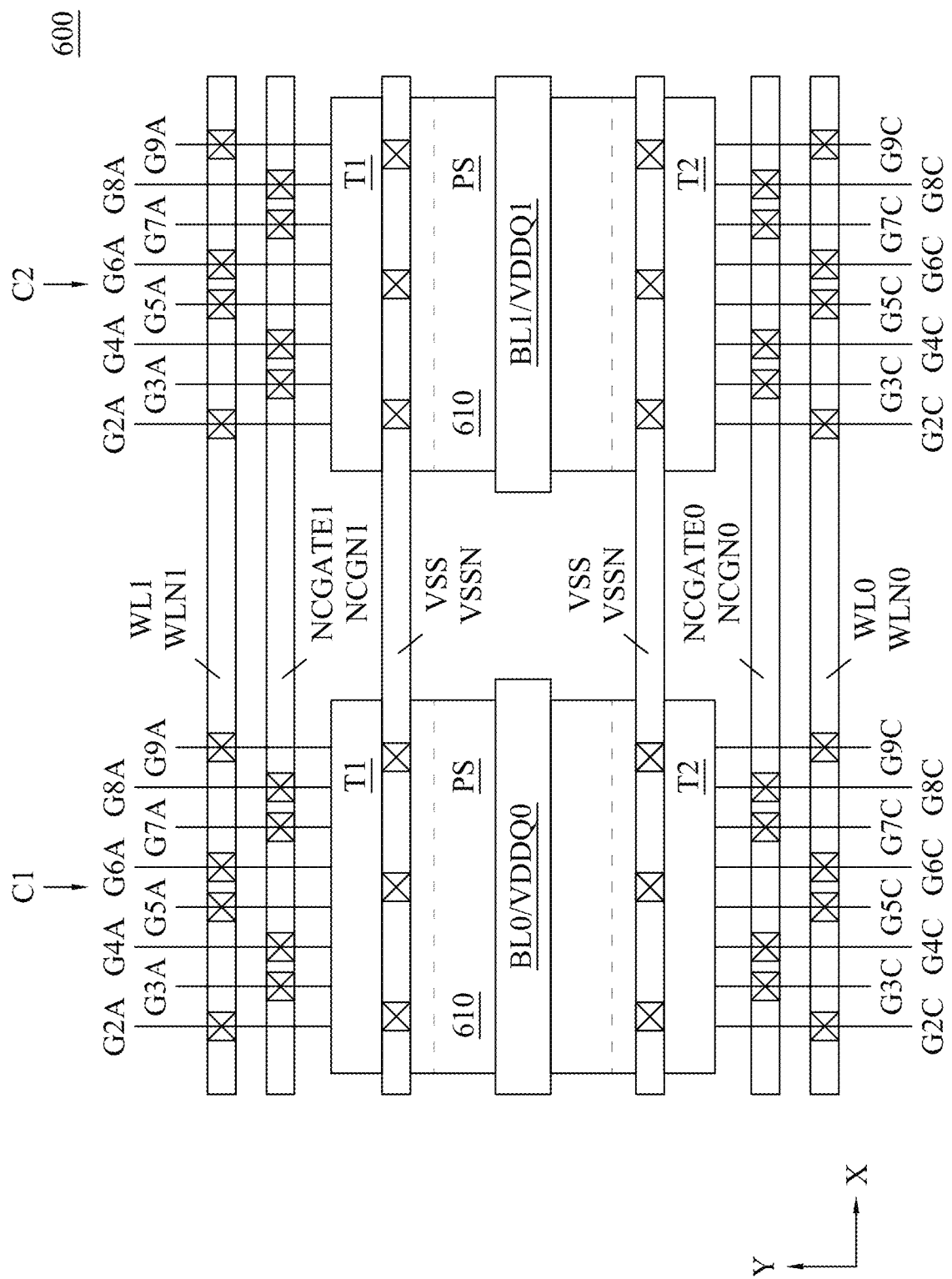
FIG. 6 is a diagram of a bit cell array, in accordance with some embodiments.

FIG. 6 is a diagram of a bit cell array 600 including IC devices 610 corresponding to instances of one of IC devices 300-500, in accordance with some embodiments. In the manner discussed above with respect to FIGS. 3-5, the depiction of bit cell array 600 in FIG. 6 corresponds both to an IC device including instances of one of IC devices 300-500 and to an IC layout diagram including instances of one of IC layout diagrams 300-500.

Bit cell array 600 includes a column C1 including a first instance of IC device 610 and a column C2 including a second instance of IC device 610. Each instance of IC device 610 includes first transistor region T1, programmable structure region PS, and second transistor region T2 configured as two instances of IC device 100 discussed above with respect to FIGS. 1A-5.

The embodiment of FIG. 6 includes a single row of two instances of IC device 610 for the purpose of illustration. In various embodiments, bit cell array 600 includes one or more columns in addition to columns C1 and C2 and/or more than a single row, each column and row including instances of IC device 610.

First and second instances of reference voltage node VSSN extend in the X direction and overlap the respective first and second transistor regions of each instance of IC device 610. Voltage nodes VSSN are electrically connected through vias (not labeled) to corresponding instances of conductive structures S1A, S5A, S9A, S1B, S5B, and S9B (not shown in FIG. 6).

Signal nodes WLN1 and NCGN1 extend in the X direction and overlap gates G2A-G9A corresponding to each instance of IC device 610. Signal node WLN1 is electrically connected through vias (not labeled) to corresponding instances of gates G2A, G5A, G6A, and G9A, and signal node NCGN1 is electrically connected through vias (not labeled) to corresponding instances of gates G3A, G4A, G7A, and G8A.

Signal nodes WLN0 and NCGN0 extend in the X direction and overlap gates G2C-G9C corresponding to each instance of IC device 610. Signal node WLN0 is electrically connected through vias (not labeled) to corresponding instances of gates G2C, G5C, G6C, and G9C, and signal node NCGN0 is electrically connected through vias (not labeled) to corresponding instances of gates G3C, G4C, G7C, and G8C.

A signal node BL0 extends in the X direction and overlaps programmable structure region PS of the first instance of IC device 610, and a signal node BL1 extends in the X direction and overlaps programmable structure region PS of the second instance of IC device 610. Each of signal nodes BL0 and BL1 is electrically connected through one or more vias (not shown) to metal lines ML3 and ML4 of the corresponding instance of IC device 610.

Reference voltage nodes VSSN are configured to carry reference voltage VSS. Signal nodes WLN1 and WLN0 correspond to instances of signal node WLN and are configured to carry respective activation signals WL1 and WL0 corresponding to activation signal WL. Signal nodes NCGN1 and NCGN0 correspond to instances of signal node NCGN and are configured to carry respective bias signals NCGATE1 and NCGATE0 corresponding to bias signal NCGATE. Signal nodes BL0 and BL1 correspond to instances of metal line BL and are configured to carry respective operational voltages VDDQ0 and VDDQ1 corresponding to activation signal VDDQ.

Bit cell array 600 is thereby configured to, in operation, perform the programming and read operations discussed above with respect to FIGS. 1A-2B including selecting bit cells based on combinations of activation signals WL1 and WL0, bias signals NCGATE1 and NCGATE0, and operational voltages VDDQ0 and VDDQ1. In some embodiments, bias signals NCGATE1 and NCGATE0 are a same bias signal or are based on activation signals WL1 and WL0 such that selecting bit cells is based solely on combinations of activation signals WL1 and WL0 and operational voltages VDDQ0 and VDDQ1.

In the embodiment of FIG. 6, in operation, the instance of IC device 100 corresponding to transistor region T1 and programmable structure region PS in column C1 is selectable based on the combination of activation signal WL1 and operational voltage VDDQ0, the instance of IC device 100 corresponding to transistor region T2 and programmable structure region PS in column C1 is selectable based on the combination of activation signal WL0 and operational voltage VDDQ0, the instance of IC device 100 corresponding to transistor region T1 and programmable structure region PS in column C2 is selectable based on the combination of activation signal WL1 and operational voltage VDDQ1, and the instance of IC device 100 corresponding to transistor region T2 and programmable structure region PS in column C2 is selectable based on the combination of activation signal WL0 and operational voltage VDDQ1.

By the configuration discussed above, bit cell array 600 includes selectable IC devices, e.g., IC devices 100, configured as OTP devices capable of realizing the benefits discussed above with respect to IC devices 100 and 300-500.

Figure 7:
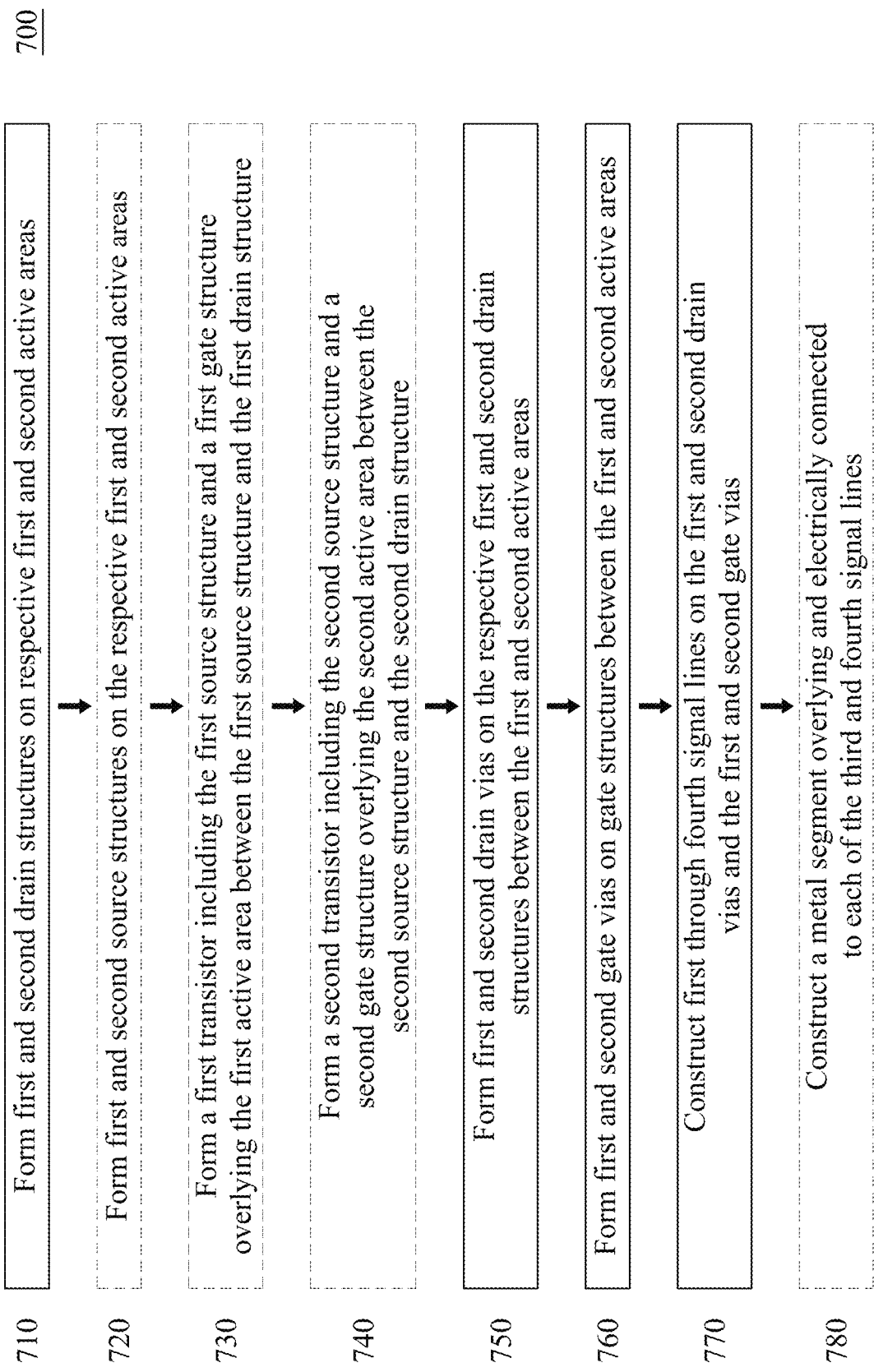
FIG. 7 is a flowchart of a method of manufacturing an IC device, in accordance with some embodiments.

FIG. 7 is a flowchart of a method 700 of manufacturing an IC device, in accordance with some embodiments. Method 700 is operable to form an IC device 100-500 discussed above with respect to FIGS. 1A-5 and/or bit cell array 600 discussed above with respect to FIG. 6.

In some embodiments, the operations of method 700 are performed in the order depicted in FIG. 7. In some embodiments, the operations of method 700 are performed in an order other than the order of FIG. 7. In some embodiments, one or more additional operations are performed before, during, and/or after the operations of method 700.

In some embodiments, one or more operations of method 700 are a subset of operations of a method of forming a memory array. In some embodiments, performing some or all of the operations of method 700 includes performing one or more operations as discussed below with respect to IC manufacturing system 1100 and FIG. 11.

At operation 710, first and second drain structures are formed on respective first and second active areas. Forming the first and second drain structures includes performing one or more manufacturing operations, e.g., a deposition and/or an implantation process, in accordance with forming one or both of conductive structures S3A or S7A on active area A1 and one or both of conductive structures S3B or S7B on active area A2 as discussed above with respect to FIGS. 3-5.

In some embodiments, forming the first and second drain structures on respective first and second active areas is part of forming pluralities of each of the first and second drain structures on pluralities of each of the respective first and second active areas as part of forming a memory array.

At operation 720, in some embodiments, first and second source structures are formed on the respective first and second active areas. Forming the first and second source structures includes performing one or more manufacturing operations, e.g., a deposition and/or an implantation process, in accordance with forming one or more of conductive structures S1A, S5A, or S9A on active area A1 and one or more of conductive structures S1B, S5B, or S9B on active area A2 as discussed above with respect to FIGS. 3-5.

In some embodiments, forming the first and second source structures on respective first and second active areas is part of forming pluralities of each of the first and second source structures on pluralities of each of the respective first and second active areas as part of forming a memory array.

At operation 730, in some embodiments, a first transistor is formed including the first source structure and a first gate structure overlying the first active area between the first source structure and the first drain structure. Forming the first transistor includes performing one or more manufacturing operations in accordance with forming transistor M1 including one or more of gates G2A, G5A, G6A, or G9A overlying active area A1 as discussed above with respect to FIGS. 3-5.

Forming a transistor, e.g., the first transistor, includes performing a plurality of manufacturing operations, e.g., one or more of a lithography, diffusion, deposition, etching, planarizing, or other operation suitable for building a gate structure adjacent to source and drain structures and overlying an active area of a semiconductor wafer.

In some embodiments, forming the first transistor is part of forming a cascode arrangement of transistors, e.g., in accordance with forming transistor M2 including one or more of gates G3A, G4A, G7A, or G8A overlying active area A1 as discussed above with respect to FIGS. 3-5.

In some embodiments, forming the first transistor is part of forming a plurality of first transistors as part of forming a memory array.

At operation 740, in some embodiments, a second transistor is formed including the second source structure and a second gate structure overlying the second active area between the second source structure and the second drain structure. In some embodiments, the second gate structure is aligned with and electrically isolated from the first gate structure. Forming the second transistor includes performing one or more manufacturing operations in accordance with forming transistor M1 including one or more of gates G2B, G5B, G6B, or G9B overlying active area A2 as discussed above with respect to FIGS. 3-5.

In some embodiments, forming the second transistor is part of forming a cascode arrangement of transistors, e.g., in accordance with forming transistor M2 including one or more of gates G3B, G4B, G7B, or G8B overlying active area A2 as discussed above with respect to FIGS. 3-5.

In some embodiments, forming the second transistor is part of forming a plurality of second transistors as part of forming a memory array.

At operation 750, first and second drain vias are formed on the respective first and second drain structures between the first and second active areas. Forming the first and second drain structures includes performing one or more manufacturing operations in accordance with forming one or both of drain via VD1 or VD2 on corresponding conductive structure S3A or S7A and one or both of drain via VD3 or VD4 on corresponding conductive structure S3B or S7B as discussed above with respect to FIGS. 3-5.

Forming a conductive structure, e.g., a gate or drain via, signal line, or metal line, includes performing a plurality of manufacturing operations including depositing and patterning one or more photoresist layers, performing one or more etching processes, and performing one or more deposition processes whereby one or more conductive materials are configured to form a continuous, low resistance structure surrounded by one or more continuous dielectric layers whereby the continuous, low resistance structure is selectively electrically connected to or isolated from various adjacent features. In some embodiments, forming a conductive structure includes performing a damascene or dual-damascene process.

In some embodiments, forming the first and second drain vias is part of forming a plurality of first and second drain vias as part of forming a memory array.

At operation 760, first and second gate vias are formed on gate structures between the first and second active areas, the first and second gate structures extending perpendicular to the first and second active areas. Forming the first and second gate vias includes performing one or more manufacturing operations in accordance with forming the first and second subsets of gate vias VG1-VG10 on the corresponding first and second subsets of gates G2B-G9B as discussed above with respect to FIGS. 3-5.

In some embodiments, forming the first and second gate vias is part of forming a plurality of first and second gate vias as part of forming a memory array.

At operation 770, first through fourth signal lines are constructed on the first and second drain vias and the first and second gate vias. Constructing the first through fourth signal lines on the first and second drain vias and the first and second gate vias includes performing one or more manufacturing operations in accordance with constructing metal line ML2 on one or both of drain vias D1 or D2, metal line ML5 on one or both of drain vias D3 or D4, metal line ML3 on the first subset of gates G2B-G9B, and metal line ML4 on the second subset of gates G2B-G9B as discussed above with respect to FIGS. 3-5.

In some embodiments, constructing the third and fourth signal lines includes constructing the third signal line separated from the first signal line by a minimum spacing rule, and constructing the fourth signal line separated from the second signal line by the minimum spacing rule.

In some embodiments, constructing the first through fourth signal lines is part of constructing a plurality of first through fourth signal lines as part of forming a memory array.

At operation 780, in some embodiments, a metal segment is constructed overlying and electrically connected to each of the third and fourth signal lines. Constructing the metal segment overlying and electrically connected to each of the third and fourth signal lines includes performing one or more manufacturing operations in accordance with constructing one or both of signal nodes BL0 or BL1 overlying and electrically connected to instances of each of metal lines ML3 and ML4 discussed above with respect to FIG. 6.

In some embodiments, constructing the metal segment is part of constructing a plurality of metal segments as part of forming a memory array.

By performing some or all of the operations of method 700, an IC device configured as two or more OTP devices is manufactured, thereby obtaining the benefits discussed above with respect to IC devices 100, 300-500 and in some embodiments bit cell array 600.

Figure 8:
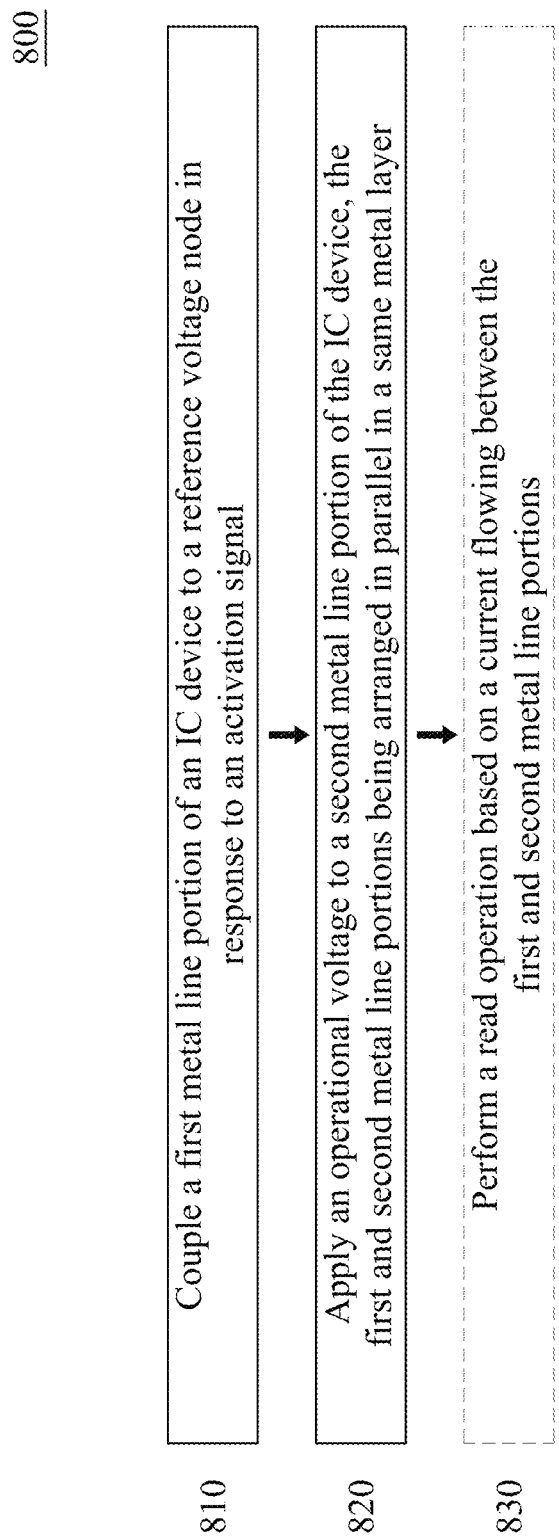
FIG. 8 is a flowchart of a method of operating an IC device, in accordance with some embodiments.

FIG. 8 is a flowchart of a method 800 of operating an IC device, in accordance with some embodiments. Method 800 is usable with an IC device including programmable structural elements, e.g., IC device 100 discussed above with respect to FIGS. 1A-5.

The sequence in which the operations of method 800 are in FIG. 8 is for illustration only; the operations of method 800 are capable of being executed in sequences that differ from that depicted in FIG. 8. In some embodiments, operations in addition to those in FIG. 8 are performed before, between, during, and/or after the operations in FIG. 8.

In some embodiments, some or all of the operations of method 800 are a subset of a method of operating a memory array including IC devices based on programmable structural elements, e.g., bit cell array 600 discussed above with respect to FIG. 6.

At operation 810, a first metal line portion of an IC device is coupled to a reference voltage node in response to an activation signal. Coupling the first metal line portion of the IC device to the reference voltage node includes coupling the first metal line overlying and electrically connected to a drain via, e.g., drain via VD discussed above with respect to FIGS. 1A-2B or a drain via VD1-VD4 discussed above with respect to FIGS. 3-5.

In some embodiments, coupling the first metal line portion of the IC device to the reference voltage node includes coupling metal line BL to reference voltage node VSSN in response to activation signal WL as discussed above with respect to FIGS. 1A-2B. In some embodiments, coupling the first metal line portion of the IC device to the reference voltage node includes coupling metal line ML2 or ML5 to reference voltage node VSSN in response to activation signal WL1 or WL0 as discussed above with respect to FIGS. 3-6.

In some embodiments, coupling the first metal line portion of the IC device to the reference voltage node includes coupling the first metal line portion of the IC device to the reference voltage node further in response to one or more bias signals, e.g., bias signal NCGATE discussed above with respect to FIGS. 1A-2B or bias signal NCGATE1 or NCGATE0 discussed above with respect to FIG. 6.

At operation 820, an operational voltage is applied to a second metal line portion of the IC device, the first and second metal line portions being arranged in parallel in a same metal layer. Applying the operational voltage to the second metal line portion includes applying the operational voltage to the second metal line portion overlying and electrically connected to a gate via, e.g., gate via VG discussed above with respect to FIGS. 1A-2B or a gate via VG1-VG10 discussed above with respect to FIGS. 3-5.

Applying the operational voltage to the second metal line portion includes generating an electric field between the first metal line portion and drain via and the second metal line portion and gate via. In some embodiments, applying the operational voltage includes applying the operational voltage having a programming magnitude as part of a programming operation or having a read magnitude as part of a read operation, as discussed above with respect to FIGS. 1A-2B.

In some embodiments, applying the operational voltage includes applying operational voltage VDDQ discussed above with respect to FIGS. 1A-2B or operational voltage VDDQ0 or VDDQ1 discussed above with respect to FIG. 6.

At operation 830, in some embodiments, a read operation is performed based on a current flowing between the first and second metal line portions. In some embodiments, performing the read operation includes performing the read operation based on current IMTV as discussed above with respect to FIGS. 1A-2B.

By executing some or all of the operations of method 800, operational and reference voltages are used to perform programming and/or read operations on an IC device configured as one or more OTP devices, thereby obtaining the benefits discussed above with respect to IC devices 100, 300-500 and in some embodiments bit cell array 600.

Figure 9:
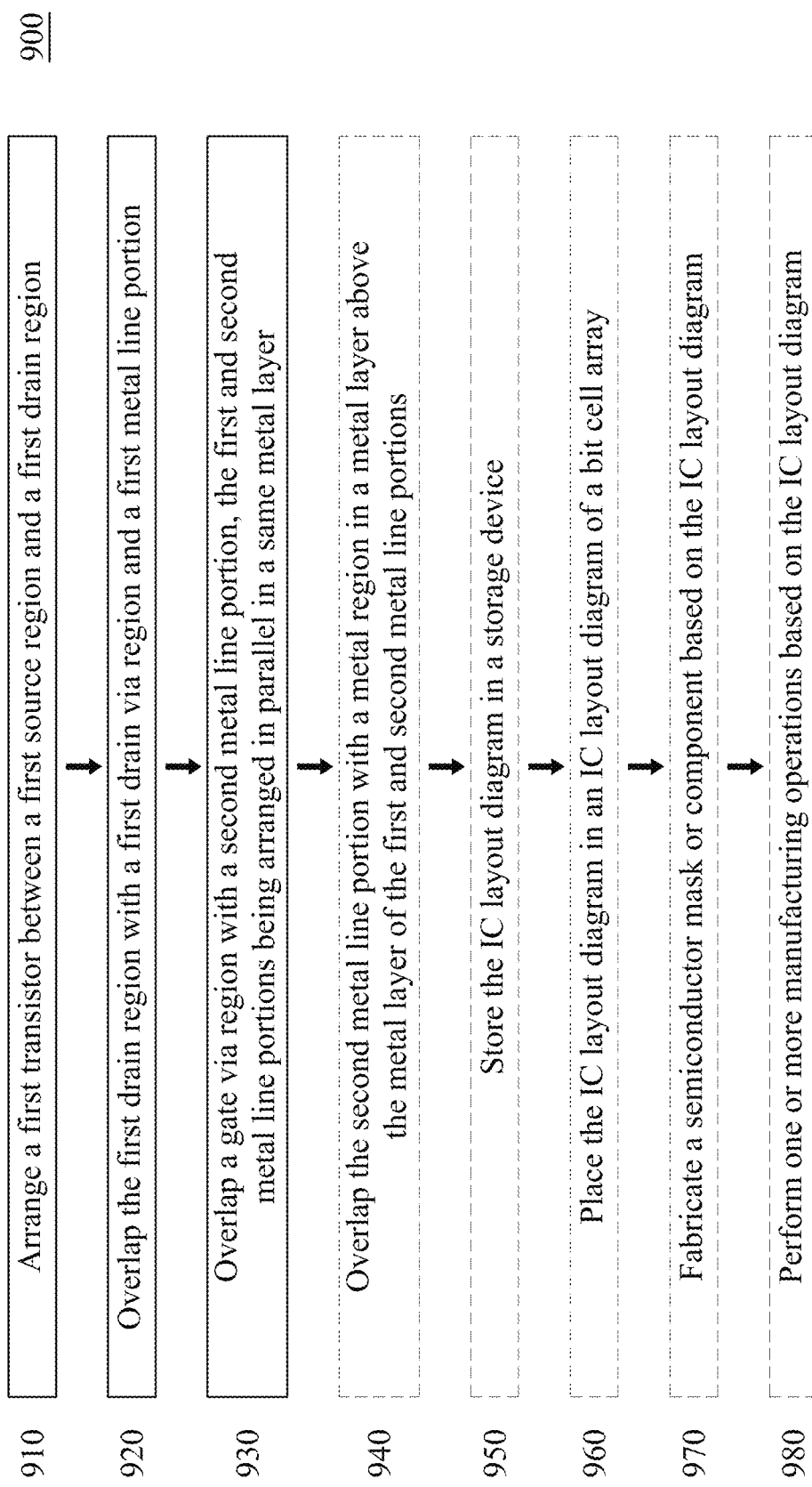
FIG. 9 is a flowchart of a method of generating an IC layout diagram, in accordance with some embodiments.

FIG. 9 is a flowchart of a method 900 of generating an IC layout diagram corresponding to an IC device, e.g., an IC layout diagram/device 300-500 discussed above with respect to FIGS. 3-5 or bit cell array 600 discussed above with respect to FIG. 6, in accordance with some embodiments.

In some embodiments, some or all of method 900 is executed by a processor of a computer, e.g., a processor 1002 of an IC layout diagram generation system 1000, discussed below with respect to FIG. 10.

Some or all of the operations of method 900 are capable of being performed as part of a design procedure performed in a design house, e.g., a design house 1120 discussed below with respect to FIG. 11.

In some embodiments, the operations of method 900 are performed in the order in FIG. 9. In some embodiments, the operations of method 900 are performed simultaneously and/or in an order other than the order in FIG. 9. In some embodiments, one or more operations are performed before, between, during, and/or after performing one or more operations of method 900.

At operation 910, in some embodiments, a first transistor is arranged between a first source region and a first drain region in an IC layout diagram. In some embodiments, arranging the first transistor includes arranging one or more instances of transistor M1 in a first and/or second transistor region, e.g., transistor region T1 and/or T2 discussed above with respect to FIGS. 1-6. In some embodiments, the first drain region extends from the first or second transistor region into a programmable structure region, e.g., programmable structure region PR discussed above with respect to FIG. 6. In some embodiments, the first drain region corresponds to one or more of conductive segments S3A, S7A, S3B, or S7B discussed above with respect to FIGS. 3-6.

The first source region is arranged to have an electrical connection to a reference voltage node, e.g., reference voltage node VSSN discussed above with respect to FIGS. 1A-6, and the first transistor includes a gate region arranged to have an electrical connection to a signal node, e.g., signal node WLN discussed above with respect to FIGS. 1A-5 or signal node WLN0 or WLN1 discussed above with respect to FIG. 6. In some embodiments, the first source region corresponds to one or more of conductive segments S1A, S5A, S9A, S1B, S5B, or S9B and the gate region corresponds to a corresponding one or more of gates G2A, G5A, G6A, G9A, G2B, G5B, G6B, or G9B discussed above with respect to FIGS. 3-6.

In some embodiments, arranging the first transistor is part of arranging at least one second transistor between the first source region and the first drain region, the at least one second transistor having a cascode arrangement including the first transistor. In some embodiments, arranging the at least one second transistor includes arranging an instance of transistor M2 including one of gates G3A, G4A, G7A, G8A, G3B, G4B, G7B, or G8B discussed above with respect to FIGS. 1-6.

In some embodiments, arranging the first transistor includes arranging a plurality of first transistors corresponding to a bit cell or a bit cell array, e.g., bit cell array 600 discussed above with respect to FIG. 6.

At operation 920, the first drain region is overlapped with a first drain via region and a first metal line portion in the IC layout diagram. In some embodiments, overlapping the first drain region includes overlapping the first drain region in the programmable structure region, e.g., programmable structure region PR discussed above with respect to FIG. 6.

In some embodiments, overlapping the first drain region with the first drain via region and the first metal line portion includes overlapping one or more drain regions corresponding to conductive segments S1A, S5A, S9A, S1B, S5B, or S9B with one or more drain via regions corresponding to drain vias VD1-VD4 and one or more metal line portions corresponding to metal lines ML2 or ML5 discussed above with respect to FIGS. 3-6.

At operation 930, a gate via region is overlapped with a second metal line portion in the IC layout diagram, the first and second metal line portions being arranged in parallel in a same metal layer. In some embodiments, overlapping the gate via region includes overlapping the gate via region in the programmable structure region, e.g., programmable structure region PR discussed above with respect to FIG. 6.

In some embodiments, overlapping the gate via region with the second metal line portion includes overlapping one or more gate via regions corresponding to the first and/or second subsets of gate vias VG1-VG10 with one or more metal line portions corresponding to metal lines ML3 or ML4 discussed above with respect to FIGS. 3-6.

At operation 940, in some embodiments, the second metal line portion is overlapped with a metal region in a metal layer above the metal layer of the first and second metal line portions in the IC layout diagram. In some embodiments, overlapping the second metal line portion includes overlapping the second metal line portion in the programmable structure region, e.g., programmable structure region PR discussed above with respect to FIG. 6.

In some embodiments, overlapping the second metal line portion with the metal region includes overlapping one or both of metal line portions corresponding to metal lines ML3 or ML4 with one or both metal regions corresponding to signal nodes BL0 or BL1 discussed above with respect to FIG. 6.

At operation 950, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram in IC design storage 1007 or over network 1014 of IC layout diagram generation system 1000, discussed below with respect to FIG. 10.

At operation 960, in some embodiments, the IC layout diagram is placed in an IC layout diagram of a bit cell array. In various embodiments, placing the IC layout diagram in the IC layout diagram of the IC die includes rotating the IC layout diagram about one or more axes, shifting the IC layout diagram relative to one or more additional IC layout diagrams in one or more directions, and/or inverting the first and second well regions.

In some embodiments, placing the IC layout diagram in the IC layout diagram of the bit cell array includes placing the IC layout diagram in the IC layout diagram of bit cell array 600 discussed above with respect to FIG. 6.

At operation 970, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 11.

At operation 980, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 11.

By executing some or all of the operations of method 900, an IC layout diagram is generated corresponding to an IC device configured as one or more OTP devices, thereby obtaining the benefits discussed above with respect to IC devices 100, 300-500 and in some embodiments bit cell array 600.

Figure 10:
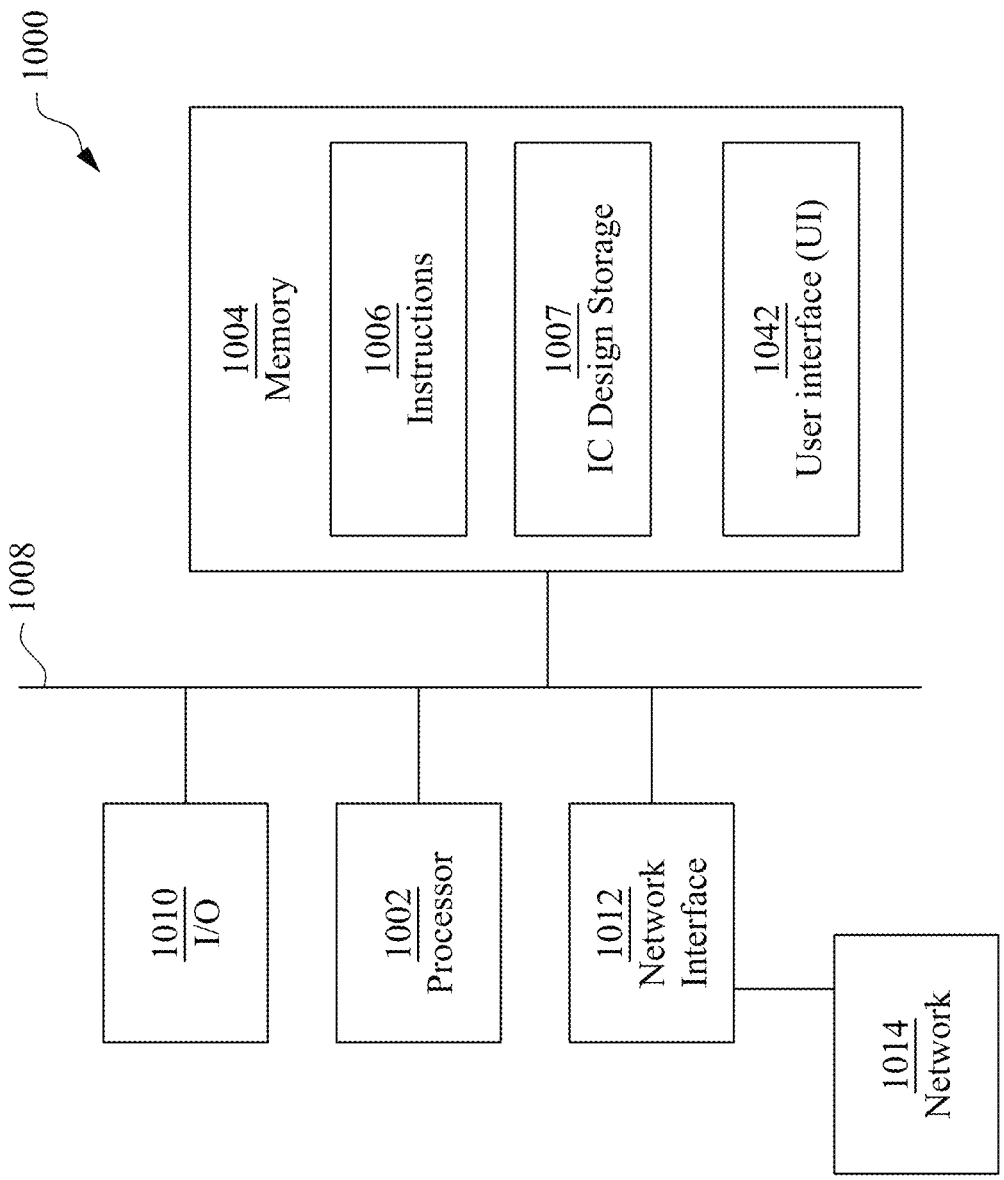
FIG. 10 is a block diagram of an IC layout diagram generation system, in accordance with some embodiments.

FIG. 10 is a block diagram of IC design system 1000, in accordance with some embodiments. Methods described herein of designing IC layout diagrams in accordance with one or more embodiments are implementable, for example, using IC design system 1000, in accordance with some embodiments. In some embodiments, IC design system 1000 is an APR system, includes an APR system, or is part of an APR system, usable for performing an APR method.

In some embodiments, IC design system 1000 is a general purpose computing device including a hardware processor 1002 and non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of a method, e.g., method 700 of generating an IC layout diagram described above (hereinafter, the noted processes and/or methods).

Processor 1002 is electrically coupled to computer-readable storage medium 1004 via a bus 1008. Processor 1002 is also electrically coupled to an I/O interface 1010 by bus 1008. Network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause IC design system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause IC design system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 includes IC design storage 1007 configured to store one or more IC layout diagrams, e.g., an IC layout diagram 300-600 discussed above with respect to FIGS. 3-6 and 9.

IC design system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

IC design system 1000 also includes network interface 1012 coupled to processor 1002. Network interface 1012 allows IC design system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC design systems 1000.

IC design system 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. IC design system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC design system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
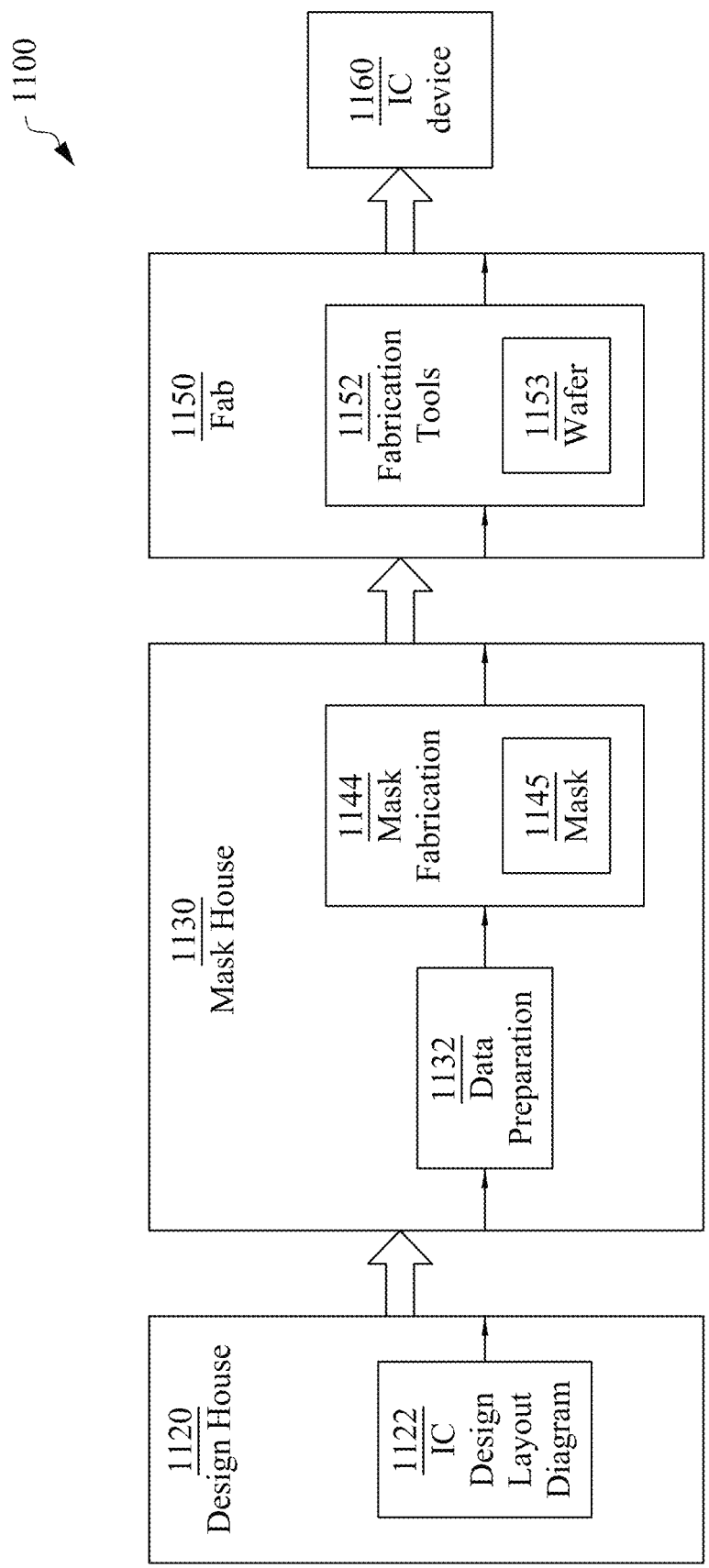
FIG. 11 is a block diagram of an IC manufacturing system, and an IC manufacturing flow associated therewith, in accordance with some embodiments.

FIG. 11 is a block diagram of IC manufacturing system 1100, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns, e.g., an IC layout diagram discussed above. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file (RDF). Mask data preparation 1132 provides the RDF to mask fabrication 1144. Mask fabrication 1144 includes a mask writer. A mask writer converts the RDF to an image on a substrate, such as mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes wafer fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

Details regarding an IC manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an IC device includes a transistor region including a source structure configured to receive a reference voltage, a first portion of a drain structure, and a gate electrode positioned between the source structure and the first portion of the drain structure, and configured to receive an activation signal, and a programmable structure region including a second portion of the drain structure, a first signal line configured to receive an operational voltage, a second signal line, a gate via underlying and electrically connected to the first signal line, and a drain via positioned between and electrically connected to the second portion of the drain structure and the second signal line. A portion of the first signal line including a location of the gate via and a portion of the second signal line including a location of the drain via are positioned in parallel in a same metal layer of the IC device.

In some embodiments, a bit cell array includes a first column including first and second transistor regions and a first programmable structure region between the first and second transistor regions, and a second column including third and fourth transistor regions and a second programmable structure region between the third and fourth transistor regions. The first through fourth transistor regions include respective first through fourth drain structures, and each of the first and second programmable structure regions includes first and second signal lines configured to receive respective first and second operational voltages, first and second gate vias underlying and electrically connected to the first and second signal lines, respectively, third and fourth signal lines, a first drain via electrically connected to the third signal line and the corresponding first or second drain structure, and a second drain via electrically connected to the fourth signal line and the corresponding third or fourth drain structure. A portion of the first signal line including a location of the first gate via and a portion of the third signal line including a location of the first drain via are arranged in parallel in a first metal layer, and a portion of the second signal line including a location of the second gate via and a portion of the fourth signal line including a location of the second drain via are arranged in parallel in the first metal layer.

In some embodiments, a method of manufacturing an IC device includes forming first and second drain structures on respective first and second active areas, forming first and second drain vias on the respective first and second drain structures between the first and second active areas, forming first and second gate vias on gate structures between the first and second active areas, the first and second gate structures extending perpendicular to the first and second active areas, constructing first and second signal lines on the first and second drain vias, the first and second signal lines extending in parallel between the first and second active areas, constructing third and fourth signal lines on the first and second gate vias, the third and fourth signal lines extending in parallel between the first and second signal lines, and constructing a metal segment overlying and electrically connected to each of the third and fourth signal lines.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) device comprising:
a transistor region comprising:
a source structure configured to receive a reference voltage;
a first portion of a drain structure; and
a gate electrode positioned between the source structure and the first portion of the drain structure, and configured to receive an activation signal; and
a programmable structure region comprising:
a second portion of the drain structure;
a first signal line configured to receive an operational voltage;
a second signal line;
a gate via underlying and electrically connected to the first signal line; and
a drain via positioned between and electrically connected to the second portion of the drain structure and the second signal line,
wherein
a portion of the first signal line including a location of the gate via and a portion of the second signal line including a location of the drain via are positioned in parallel in a same metal layer of the IC device, and
a top portion of at least one of the gate via or the drain via extends between the first and second signal lines.

2. The IC device of claim 1, wherein the same metal layer is a first metal layer of the IC device.

3. The IC device of claim 1, wherein
the gate via is a first gate via of two gate vias underlying and electrically connected to the first signal line, and
each of the location of the first gate via and a location of a second gate via corresponds to a gate structure adjacent to the second portion of the drain structure.

4. The IC device of claim 1, wherein
the gate via is a first gate via,
the drain structure is a first drain structure,
the drain via is a first drain via, and
the programmable structure region further comprises:
a third signal line adjacent to the first signal line and configured to receive the operational voltage;
a fourth signal line adjacent to the third signal line;
second and third gate vias underlying and electrically connected to the third signal line;
a second drain structure; and
a second drain via positioned between and electrically connected to the second drain structure and the fourth signal line.

5. The IC device of claim 4, wherein the programmable structure region further comprises a fourth gate via underlying and electrically connected to the first signal line.

6. The IC device of claim 1, wherein the transistor region comprises an n-type metal-oxide-semiconductor (NMOS) transistor comprising the source structure and the gate electrode.

7. The IC device of claim 1, wherein
the gate electrode is a first gate electrode, and
the transistor region comprises:
a first transistor comprising the source structure, the first gate electrode, and a shared source/drain (S/D) structure; and
a second transistor comprising the shared S/D structure, the first portion of the drain structure, and a second gate electrode configured to receive a cascode bias voltage.

8. The IC device of claim 1, wherein the programmable structure region comprises a gate electrode aligned with and electrically isolated from the gate electrode of the transistor region.

9. The IC device of claim 1, wherein the programmable structure region comprises a metal segment in a metal layer above the same metal layer of the IC device, the first signal line being configured to receive the operational voltage from the metal segment.

10. The IC device of claim 1, wherein
the portion of the first signal line including the location of the gate via and the portion of the second signal line including the location of the drain via extend in a first direction, and
the gate via and the drain via are offset from each other in the first direction.

11. A bit cell array comprising:
a first column comprising first and second transistor regions and a first programmable structure region between the first and second transistor regions; and
a second column comprising third and fourth transistor regions and a second programmable structure region between the third and fourth transistor regions, wherein
the first through fourth transistor regions comprise respective first through fourth drain structures,
each of the first and second programmable structure regions comprises:
first and second signal lines configured to receive respective first and second operational voltages;
first and second gate vias underlying and electrically connected to the first and second signal lines, respectively;
third and fourth signal lines;
a first drain via electrically connected to the third signal line and the corresponding first or second drain structure; and
a second drain via electrically connected to the fourth signal line and the corresponding third or fourth drain structure, wherein
a portion of the first signal line including a location of the first gate via and a portion of the third signal line including a location of the first drain via are arranged in parallel in a first metal layer, and
a portion of the second signal line including a location of the second gate via and a portion of the fourth signal line including a location of the second drain via are arranged in parallel in the first metal layer.

12. The bit cell array of claim 11, wherein
each of the first through fourth transistor regions comprises a respective first through fourth transistor configured to selectively couple the corresponding first through fourth drain structure to a source structure configured to receive a reference voltage,
the first and third transistors comprise gates configured to receive a first activation signal, and
the second and fourth transistors comprise gates configured to receive a second activation signal.

13. The bit cell array of claim 12, wherein each of the first through fourth transistors comprises an n-type metal-oxide-semiconductor (NMOS) transistor.

14. The bit cell array of claim 11, wherein
each of the first through fourth transistor regions further comprises a respective fifth through eighth drain structure, and
each of the first and second programmable structure regions further comprises:
  third and fourth gate vias underlying and electrically connected to the first and second signal lines, respectively;
  a third drain via electrically connected to the third signal line and the corresponding fifth or sixth drain structure; and
  a fourth drain via electrically connected to the fourth signal line and the corresponding seventh or eighth drain structure.

15. The bit cell array of claim 14, wherein
the first and third gate vias are a first gate via pair adjacent to the third drain structure, and
the second and fourth gate vias are a second gate via pair adjacent to the second drain structure.

16. The bit cell array of claim 14, wherein
the first and second gate vias are included in a first triangle pattern of gate vias adjacent to the first drain structure, and
the third and fourth gate vias are included in a second triangle pattern of gate vias adjacent to the fourth drain structure.

17. The bit cell array of claim 14, wherein
the first and second gate vias are included in a first parallelogram pattern of gate vias adjacent to the first drain structure, and
the third and fourth gate vias are included in a second parallelogram pattern of gate vias adjacent to the fourth drain structure.

18. A method of manufacturing an integrated circuit (IC) device, the method comprising:
  forming first and second drain structures on respective first and second active areas;
  forming first and second drain vias on the respective first and second drain structures between the first and second active areas;
  forming first and second gate vias on gate structures between the first and second active areas, the first and second gate structures extending perpendicular to the first and second active areas;
  constructing first and second signal lines on the first and second drain vias, the first and second signal lines extending in parallel between the first and second active areas;
  constructing third and fourth signal lines on the first and second gate vias, the third and fourth signal lines extending in parallel between the first and second signal lines; and
  constructing a metal segment overlying and electrically connected to each of the third and fourth signal lines.

19. The method of claim 18, further comprising:
  forming first and second source structures on the respective first and second active areas;
  constructing a first transistor comprising the first source structure and a first gate structure overlying the first active area between the first source structure and the first drain structure; and
  constructing a second transistor comprising the second source structure and a second gate structure overlying the second active area between the second source structure and the second drain structure,
  wherein the second gate structure is aligned with and electrically isolated from the first gate structure.

20. The method of claim 18, wherein the constructing the third and fourth signal lines comprises:
  constructing the third signal line separated from the first signal line by a minimum spacing rule; and
  constructing the fourth signal line separated from the second signal line by the minimum spacing rule.

* * * * *